United States Patent
Weber

(10) Patent No.: US 10,879,350 B2
(45) Date of Patent: Dec. 29, 2020

(54) METHOD FOR FORMING A SUPERJUNCTION TRANSISTOR DEVICE

(71) Applicant: Infineon Technologies Austria AG, Villach (AT)

(72) Inventor: Hans Weber, Bayerisch Gmain (DE)

(73) Assignee: Infineon Technologies Austria AG, Villach (AT)

( * ) Notice: Subject to any disclaimer, the term of this patent is extended or adjusted under 35 U.S.C. 154(b) by 17 days.

(21) Appl. No.: 16/354,773

(22) Filed: Mar. 15, 2019

(65) Prior Publication Data

US 2019/0288061 A1    Sep. 19, 2019

(30) Foreign Application Priority Data

Mar. 16, 2018  (DE) .................. 10 2018 106 124

(51) Int. Cl.
| | |
|---|---|
| *H01L 29/06* | (2006.01) |
| *H01L 21/266* | (2006.01) |
| *H01L 29/78* | (2006.01) |
| *H01L 21/225* | (2006.01) |
| *H01L 21/265* | (2006.01) |
| *H01L 29/66* | (2006.01) |

(52) U.S. Cl.
CPC ........ *H01L 29/0634* (2013.01); *H01L 21/225* (2013.01); *H01L 21/266* (2013.01); *H01L 21/2656* (2013.01); *H01L 29/66712* (2013.01); *H01L 29/7811* (2013.01); *H01L 29/7813* (2013.01)

(58) Field of Classification Search
CPC ............... H01L 21/225; H01L 21/2253; H01L 21/2656; H01L 21/26586; H01L 21/266; H01L 29/0634; H01L 29/66712; H01L 29/66734; H01L 29/7811; H01L 29/7813
See application file for complete search history.

(56) References Cited

U.S. PATENT DOCUMENTS

| | | | |
|---|---|---|---|
| 2010/0044791 | A1 | 2/2010 | Hebert |
| 2016/0268367 | A1* | 9/2016 | Ishiguro ............ H01L 29/66712 |
| 2017/0125580 | A1* | 5/2017 | Kowalik-Seidl .... H01L 29/0634 |
| 2018/0019132 | A1* | 1/2018 | Mauder ............. H01L 29/66712 |

FOREIGN PATENT DOCUMENTS

DE    102017115412 A1    1/2018

* cited by examiner

*Primary Examiner* — Joseph M Galvin, III
(74) *Attorney, Agent, or Firm* — Murphy, Bilak & Homiller, PLLC

(57) ABSTRACT

A method for forming a transistor device includes: implanting dopant atoms of a first doping type and dopant atoms of a second doping type into opposite sidewalls of each of a plurality of trenches of a first semiconductor layer having a basic doping of the first doping type, the dopant atoms of the first doping type having a smaller diffusion coefficient than the dopant atoms of the second doping type; filling each trench with a second semiconductor layer of the first doping type; and diffusing the dopant atoms of the first doping type and the dopant atoms of the second doping type such that a plurality of first regions of the first doping type and a plurality of second regions of the second doping type are formed. The second regions are spaced apart from each other. Each first region is at least partially arranged within a respective second region.

19 Claims, 11 Drawing Sheets

METHOD FOR FORMING A SUPERJUNCTION TRANSISTOR DEVICE

TECHNICAL FIELD

This disclosure in general relates to a method for producing a superjunction device, in particular for producing a drift region with n-type regions and p-type regions in a superjunction device.

BACKGROUND

A superjunction device, which often is also referred to as compensation device, includes a drift region with a plurality of first regions of a first doping type (conductivity type) and a plurality of second region of a second doping type (conductivity type) complementary to the first doping type. In some publications, the at least one region of the first doping type is referred to as drift region and the at least one region of the second doping type is referred to as compensation region.

In a vertical superjunction transistor device the plurality of first regions and the plurality of second regions are arranged alternatingly in a lateral direction of a semiconductor body in which the drift region is integrated. A pitch is given by a width of one first region in the lateral direction plus a width of an adjoining second region in the lateral direction. It is desirable to produce a drift region of a superjunction transistor device with a small pitch.

SUMMARY

One example relates to a method. The method includes implanting dopant atoms of a first doping type and dopant atoms of a second doping type in a first implantation process into opposite sidewalls of each of a plurality of trenches of a first semiconductor layer having a basic doping of a first doping type, wherein the dopant atoms of the first doping type have a smaller diffusion coefficient than the dopant atoms of the second doping type. The method further includes filling each of the plurality of trenches with a second semiconductor layer of the first doping type and diffusing the dopant atoms of the first doping type and the dopant atoms of the second doping type in a first diffusion process such that a plurality of first regions of the first doping type and a plurality of second regions of the second doping type are formed, wherein the plurality of second regions are spaced apart from each other and each of the plurality of first regions is at least partially arranged within a respective one of the plurality of second regions.

Those skilled in the art will recognize additional features and advantages upon reading the following detailed description, and upon viewing the accompanying drawings.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1A:
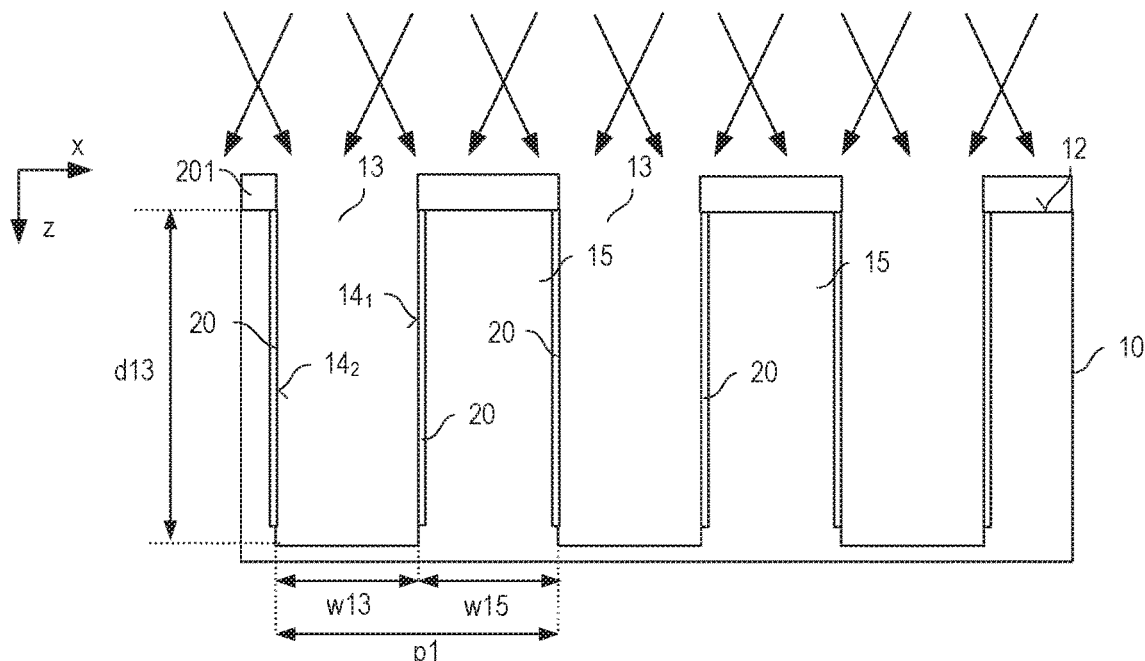
FIGS. 1A-1C illustrate one example of a method for producing complementarily doped semiconductor regions in a semiconductor layer.
Figure 1B:
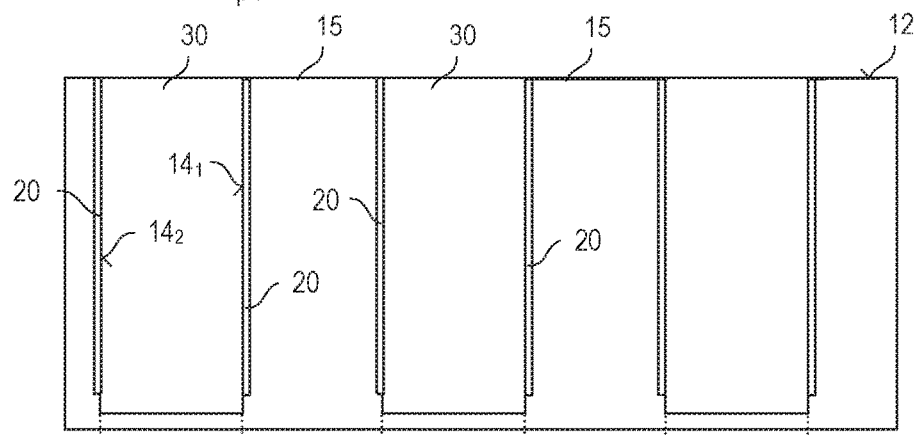
Figure 1C:
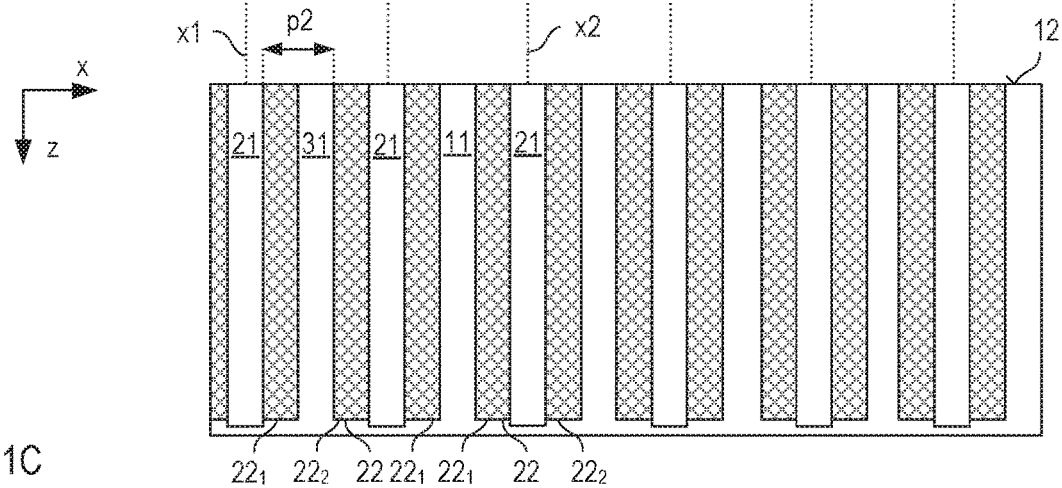

FIGS. 1A-1C illustrate one example of a method for forming a plurality of complementarily doped semiconductor regions in a semiconductor arrangement that includes a first semiconductor layer 10 and a second semiconductor layer 30. FIG. 1A shows a vertical cross sectional view of the first semiconductor layer 10 in a vertical section plane that is perpendicular to a first surface 12 of the first semiconductor layer 10, and FIGS. 1B-1C illustrate vertical cross sectional views of the semiconductor arrangement with the first and second semiconductor layers 10, 30. According to one example, each of the first and second semiconductor layers 10, 30 includes a monocrystalline semiconductor material, such as, for example, silicon (Si), silicon carbide (SiC), gallium arsenide (GaAs), gallium nitride (GaN) or the like.

The first semiconductor layer 10 shown in FIG. 1A has a basic doping of a first doping type, which is either an n-type or a p-type. A doping concentration of the basic doping is, for example, in a range of between 1E15 $cm^{-3}$ and 5E17 $cm^{-3}$. According to one example, the first doping type is an n-type, and dopant atoms included in the first semiconductor layer 10 and forming the basic doping are phosphorous (P) atoms. The first semiconductor layer 10 includes a plurality of trenches 13. These trenches 13 extend into the semiconductor layer 10 from the first surface 12 in a vertical direction z of the first semiconductor layer 10, are spaced apart from each other in a lateral direction x of the semiconductor layer 10. Neighboring trenches 13 are separated from each other by mesa regions 15.

Referring to FIG. 1A, the method includes implanting dopant atoms of the first doping type and dopant atoms of a second doping type complementary to the first doping type in a first implantation process into opposite sidewalls $14_1$, $14_2$ of each of the plurality of trenches 13 of the semiconductor layer 10. The first implantation process may include four sub-processes, a first sub-process in which dopant atoms of the first doping type are implanted into first sidewalls $14_1$ of the plurality of trenches 13; a second sub-process in which dopant atoms of the first doping type are implanted into second sidewalls $14_2$ opposite the first sidewalls $14_1$ of the plurality of trenches 13; a third sub-process in which dopant atoms of the second doping type are implanted into the first sidewalls $14_1$ of the plurality of trenches 13; and a fourth sub-process in which dopant atoms of the second doping type are implanted into the second sidewalls $14_2$ of the plurality of trenches 13. In this first implantation process, implanted regions 20 are formed in the semiconductor layer 10 adjacent each of the first and second sidewalls $14_1$, $14_2$ of the plurality of trenches 13. Each of these implanted regions 20 includes dopant atoms of the first doping type and dopant atoms of the second doping type. These dopant atoms are selected such that the dopant atoms of the first doping type have a smaller diffusion coefficient than the dopant atoms of the second doping type. According to one example, the first doping type is an n-type and the second doping type is a p-type. In this case, the dopant atoms of the first doping type are arsenic (As) atoms, for example, and the dopant atoms of the second doping type are boron (B) atoms, for example.

According to one example (illustrated in dashed lines in FIG. 1A), the first surface 12 of the semiconductor layer 10 is covered by an implantation mask 201 during the first implantation process, so that dopant atoms are implanted into the sidewalls $14_1$, $14_2$ of the trenches 13, but not into the first surface 12. Each of the four sub-processes explained before, is a tilted implantation process, which means that an implantation direction in which the dopant atoms are implanted is different from a vertical of the first surface 12.

Referring to FIG. 1B, the method further includes filling each of the plurality of trenches 30 with the monocrystalline second semiconductor layer 30 of the first doping type. Forming the second semiconductor layer 30 may include an epitaxial growth process. In the example illustrated in FIG. 1B, the second semiconductor layer 30 only fills the trenches 12 and is not arranged on top of the mesa regions 12. This, however, is only an example. The second semiconductor layer can also be implemented such that it fills the trenches 13 and covers the mesa regions 15. The second semiconductor layer 30 has a basic doping concentration of the first doping type. According to one example, a doping concentration of the basic doping at least approximately equals the basic doping concentration of the first semiconductor layer 10. Examples of how the second semiconductor layer 30 can be formed are explained in detail herein further below.

The method further includes activating and diffusing the implanted dopant atoms of the first doping type and the implanted dopant atoms of the second doping type in a temperature process. FIG. 1C illustrates the semiconductor layer 10 after this temperature process. A temperature, an atmosphere and a duration of this temperature process are selected such that based on the implanted dopant atoms of the first doping type a plurality of first regions 21 of the first doping type are formed and that based on the implanted dopant atoms of the second doping type, a plurality of second regions of the second doping type are formed. In particular, the duration, the atmosphere and the temperature of the temperature process are such that the second regions 22 are formed such that the second doped regions 22 are spaced apart from each other in the lateral direction x. That is, between two neighboring second doped regions 22 either a third region 11 of the first doping type or a fourth region 31 of the first doping type is arranged. The third regions 11 are formed by sections of the mesa region 15 that have the basic doping of the first semiconductor layer 10, and the fourth regions 31 are formed by those sections of the second semiconductor layer 30 that fill the trenches 30 and have the basic doping of the second semiconductor layer 30. In the temperature process, the dopant atoms of the second doping type, in the lateral direction x, diffuse into the mesa regions 15 and into the second semiconductor layer 30. However, the diffusion process is such that sections of the mesa regions 15 that have the basic doping of the first semiconductor layer 10 and sections of the second semiconductor layer 30 that have the basic doping remain. These "remaining sections" form the third and fourth doped regions 11, 31.

In the diffusion process, also the dopant atoms of the first doping type included in the implanted regions 20 diffuse. Due to the smaller diffusion coefficient these dopant atoms of the first doping type diffuse slower and, therefore, not as far as the dopant atoms of the second doping type. Based on these dopant atoms of the first doping type the first regions 21 are formed, wherein each of the first regions 21 is at least partially arranged within a respective one of the second regions 22. That is, in the lateral direction x, each of the first regions 21 is separated by the second region 22 either from a third region 11 or a fourth region 31. In other words, each of the second regions 22 includes a first section $22_1$ between the respective first region 21 and an adjoining third region 11 and a second section $22_2$ arranged between the respective first region 21 and an adjoining fourth region 31.

According to one example, a duration of the temperature process is selected from a range of between 900° C. and 1150° C., and a duration is selected from between 15 minutes and 10 hours. The atmosphere in the temperature process is an inert or an oxidizing atmosphere, for example. According to one example, the temperature process includes several sub-processes with different temperatures each selected from the temperature range explained above. Forming an arrangement of the type shown in FIG. 1C may include further diffusion processes. Thus, the diffusion process explained with reference to FIG. 1C is also referred to as first diffusion process in the following.

Referring to the above, the first regions 21 have the first doping type. This means, that the first regions 21 have an effective doping concentration of the first doping type. That is, a concentration of the dopant atoms of the first doping type prevail in the first regions 21, resulting in an effective doping concentration of the first doping type. Equivalently, in the second regions 22 of the second doping type dopant atoms of the second doping type prevail resulting in an effective doping concentration of the second doping type.

Referring to FIG. 1A, each of the trenches 13 has a width w13 in the lateral direction x, and each of the mesa regions has a width w15 in the lateral direction x. A pitch p1 of the structure with the trenches 13 and the mesa regions 15 is given by the width w13 of the trenches 13 plus the width w15 of the mesa regions 15, that is, p1=w13+w15. This pitch p1 is referred to as first pitch in the following. According to one example, the width w13 of the trenches 13 and the width w15 of the mesa regions 15 are essentially the same, which means that the width w15 of the mesa regions 15 is between 100% and 130%, in particular between 105% and 115% of the width w13 of the trenches 13 (1.0·w13<w15<1.3·w13 or 1.05·w13<w15<1.11·w13). According to one example, the width w15 of the mesa regions 15 is greater than the width w13 of the trenches 13 and adapted to a width w20 of the implanted regions 20 illustrated in FIG. 1B such that the implanted regions 20 are equidistant in the lateral direction x. The width of the implanted regions is their dimension in the lateral direction. Let w20 be the width of one implanted region 20, then, for example, the mesa region 15 is produced such that its width w15 is given by w15=w13+2·w20.

According to one example, the width w13 of the trenches 13 is selected from between 0.5 micrometers (μm) and 6 micrometers, in particular between 1 micrometer and 3 micrometers. According to one example, the trenches 13 are formed such that an aspect ratio, which is a ratio between a depth d13 and the width w13 of the trenches is between 10:1 and 1:1, in particular between 6:1 and 1:1. The "depth d13" of the trenches 13 is the dimension of the trenches 13 in the vertical direction z.

In FIG. 1C, x1 denotes a lateral position of the semiconductor structure with the first semiconductor layer 10 and the filling material 30 at which a second sidewall $14_2$ of one trench 13 was located before filling the trench with the filling material 30. Equivalently, x2 denotes a lateral position at which the second sidewall $14_2$ of a neighbouring trench was located before the trench was filled with the filling material 30. A distance between the first position x1 and the second position x2 is given by the first pitch p1. Referring to FIG. 1C, in the semiconductor arrangement shown in FIG. 1C, between the first position x1 and the second position x2 the following doped regions are arranged: one half of a first region 21; a second section $22_2$ of a second region 22; a fourth region 31; a second section $22_2$ of a second region 22; a first region 21; a first section $22_1$ of a second region 22; a third region 11; a first section $22_1$ of a second region 22; and one half of a first region 21. In this semiconductor arrangement, in the lateral direction x, regions of the first doping type and regions of the second doping type are arranged alternatingly, wherein regions of the first doping type are first regions 21, third regions 11, and fourth regions 31, and regions of the second doping type are first and second sections $22_1$, $22_2$ of the second regions 22. It can be seen that in a section of the semiconductor arrangement that has a width corresponding to the first pitch p1 four regions of the first doping type and four regions of the second doping type are arranged, so that a second pitch p2 of the structure formed by the complementarily doped regions in the semiconductor arrangement is ¼ of the first pitch p1 (p2=¼·p1). In the example illustrated in FIG. 1C, the regions of the first doping type, that is, the first regions 21, the third regions 11 and the fourth regions 31 are drawn such that, in the lateral direction x, they have essentially the same width. Further, the first and second sections $22_1$, $22_2$ of the second regions 22 are drawn such that their width essentially equals the width of the doped regions of the first doping type. This, however, is only an example. That is, the width of the first and second sections $22_1$, $22_2$ of the second region 22 can be different from the width of the regions 21, 11, 31 of the first doping type. Further, the first, third and fourth regions 21, 11, 31 can be distinct with regard to their widths. Nevertheless, the average second pitch p2 is one quarter (¼) of the first pitch p1.

Figure 2:
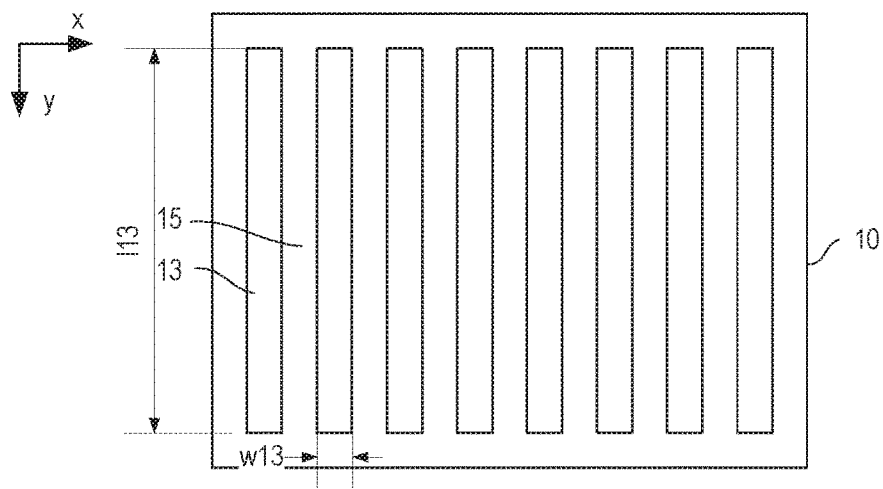
FIG. 2 shows a top view of the semiconductor layer according to one example.

According to one example, the trenches 13 are elongated trenches. This is illustrated in FIG. 2 that shows a top view of the first semiconductor layer 10 according to one example.

According to one example, the first region 21 extends beyond the second region 22 in the vertical direction z at an end of the second region 22 facing away from the first surface 12. This is illustrated in FIG. 1C. In the diffusion process, the dopant atoms of the first and second doping type diffuse from the implanted regions 20 not only in the lateral direction x, but also in the vertical direction z. In order to achieve a structure in which the first regions 21, in the vertical direction z, extend beyond the second regions 22, the dopant atoms may be implanted such that the faster diffusing dopant atoms of the second doping type are implanted only into upper sidewall sections of the first and second sidewalls $14_1$, $14_2$, while the dopant atoms of the first doping type are implanted into the upper sidewall sections as well as into lower sidewall sections of the first and second sidewalls $14_1$, $14_2$. Sections of the sidewall into which the dopant atoms are implanted, can be adjusted by suitably selecting implantation angles in the first implantation process. This is explained in the following.

Figure 3A:
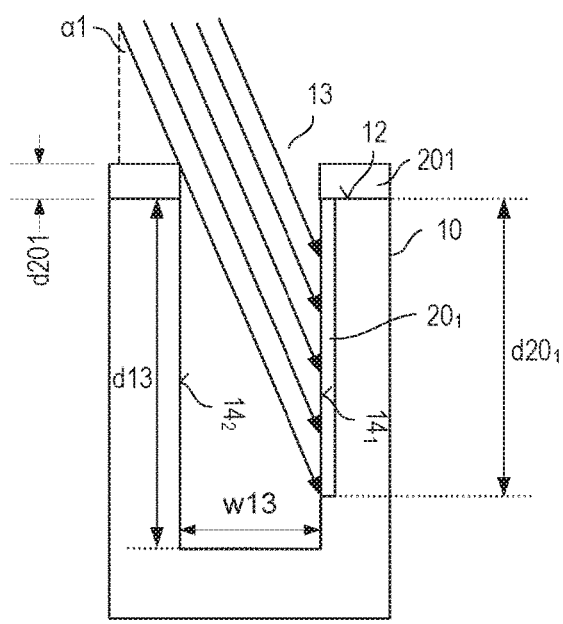
FIGS. 3A-3B illustrate one example of an implantation process illustrated in FIG. 1A in greater detail.
Figure 3B:
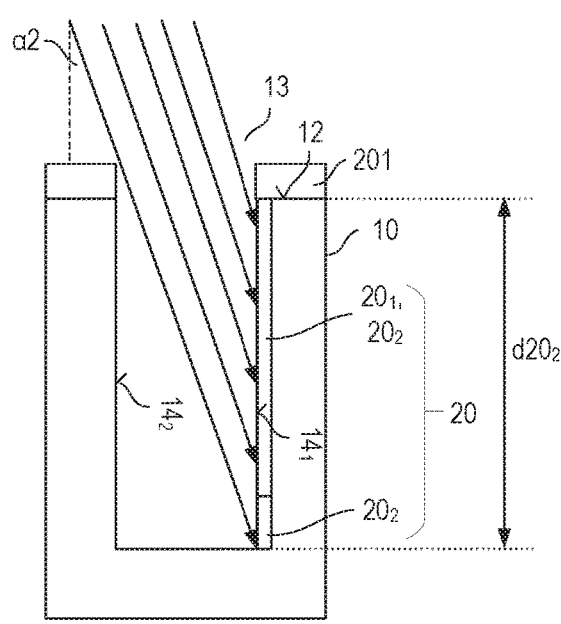

FIGS. 3A and 3B illustrate one example of a first implantation process in which dopant atoms of the second doping type are implanted into upper sidewall sections and dopant atoms of the first doping type are implanted into upper and lower sidewall sections. More specifically, FIGS. 3A and 3B illustrate implanting dopant atoms of the first doping type and dopant atoms of the second doping type into the first sidewall $14_1$ of one trench 13. This takes place in the first and third sub-process explained before. Dopant atoms of the first doping type and the second doping type can be implanted into the second sidewalls $14_2$ in an equivalent process.

FIG. 3A illustrates implanting dopant atoms of the first doping type into a first sidewall section of the first sidewall $14_1$ in order to form a first section $20_1$ of the implanted region 20. Implanting the dopant atoms of the first doping type includes a tilt implantation process, which is an implantation process in which an implantation direction is inclined relative to the vertical of the first surface 12. In FIG. 3A, α1 denotes a tilt angle, which is the angle between the implantation direction and the vertical of first surface 12. This tilt angle α1, which is also referred to as first tilt angle in the following, defines a depth $d20_1$ of the first section $20_1$ of the implanted region 20 in the vertical direction z, wherein $$d20_1 = \frac{w13}{\sin\alpha 1} - d201, \tag{1a}$$

wherein w13 is the width of the trench 13 and d201 is a thickness of the implantation mask 201. The first tilt angle α1 is chosen such that the depth $d20_1$ of the first section $20_1$ is less than the depth d13 of the trench 13.

FIG. 3B illustrates implanting dopant atoms of the second doping type into the first sidewall $14_1$ in order to form a second section $20_2$ of the doped region 20. This second section $20_2$ extends deeper in the vertical direction z, so that a depth $d20_2$ of this second section $20_2$ is greater than the depth $d20_1$ of the first section $20_1$ ($d20_2 > d20_1$). The depth $d20_2$ of the second section is defined by a second tilt angle α2 in this implantation process, wherein the depth $d20_2$ is given by:

$$d20_2 = \frac{w13}{\sin\alpha 2} - d201. \tag{1b}$$

The second tilt angle α2 can be adjusted such that the depth $d20_2$ of the second section $20_2$ equals the depth d13 of the trench 13. According to another example, the second tilt angle α2 is selected such that the depth $d20_2$ of the second section $20_2$ is smaller than the depth d13 of the trench 13.

Referring to the above, the dopant atoms of the second doping type implanted in the first implantation process illustrated in FIG. 3A diffuse faster in the first diffusion process than the dopant atoms of the first doping type implanted in the first implantation process illustrated in FIG. 3B. Let Δd be a difference between a length the dopant atoms of the second doping type diffuse in the first diffusion process and a length the dopant atoms of the first doping type diffuse in the first diffusion process, then, according to one example, the depths $d20_1$, $d20_2$ of the first and second sections $20_1$, $20_2$ are selected such that a difference $d20_2-d20_1$ is at least Δd, $$d20_2 - d20_1 \geq \Delta d \qquad (2),$$

in order to achieve that in a structure of the type illustrated in FIG. 1C, the first regions 21, in the vertical direction z, extend beyond the second regions 22.

FIGS. 3A-3B illustrate implanting dopant atoms of the second doping type (see FIG. 3A) and dopant atoms of the first doping type (see FIG. 3B) into the first sidewall $14_1$ of one trench 13. Implanting dopant atoms of the first doping type and dopant atoms of the second type into the opposite second sidewall $14_2$ takes place in an equivalent way, wherein implanting the dopant atoms of the second doping type into the second sidewall $14_2$ includes implanting the dopant atoms using a third tilt angle α3, wherein α3=−α1, and wherein implanting the dopant atoms of the first doping type includes implanting the dopant atoms using a fourth tilt angle α4, wherein α4=−α2.

According to one example, the tilt angles α1, α2, dependent on the aspect ratio of the trenches 13, are selected from between 11° and 27°.

Figure 4A:
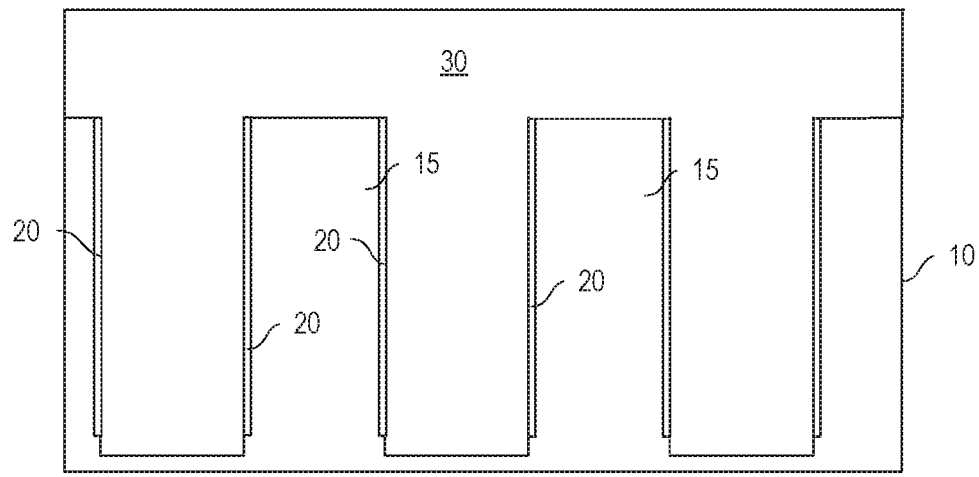
FIGS. 4A-4B illustrate one example of a method for filling trenches in the semiconductor layer.
Figure 4B:
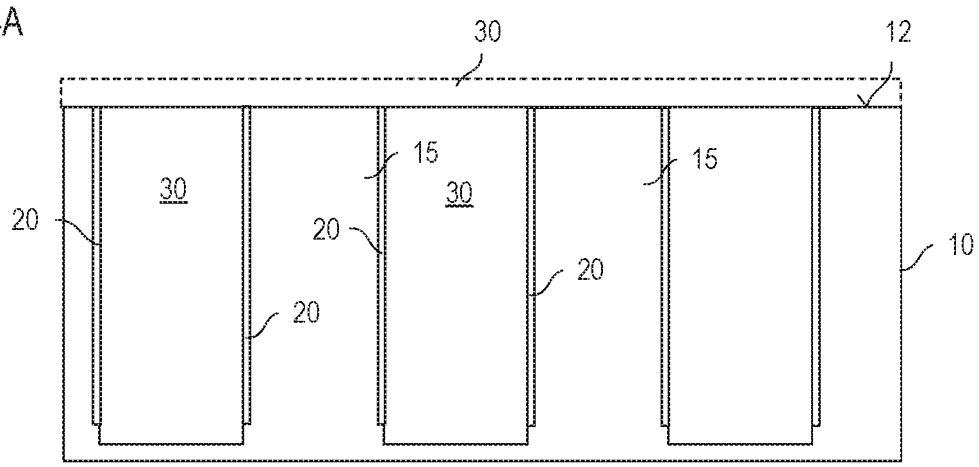

FIGS. 4A to 4B illustrate one example of a method for filling the trenches 13. Referring to FIG. 4A, this method includes forming the second semiconductor layer 30 such that it completely fills the trenches 13 and covers the first surface 12 on top of the mesa regions 15. Forming the second semiconductor layer 30 may include an epitaxial growth process, wherein the second semiconductor layer 30 is in situ doped with dopant atoms of the second doping type during the epitaxial growth process.

Referring to FIG. 4B, the method, optionally, further includes at least partially removing the second semiconductor layer 30 above the first surface 12 of the first semiconductor layer 10. This may include removing the second semiconductor layer 30 down to the first surface 12, so that the second semiconductor layer 30 only remains in the trenches 12. According to another example, illustrated in dashed lines in FIG. 4B, the removal process can be stopped before the second layer 30 has been removed down to the first surface 12. The removal process may include an etching process or a polishing process such as, for example, a CMP (chemical mechanical polishing) process. The removal process, however, is optional. That is, filling the trenches with the second semiconductor material may include filling the trenches and forming the second semiconductor layer 13 on top of the mesa regions 15, as shown in FIG. 4A.

Figure 5A:
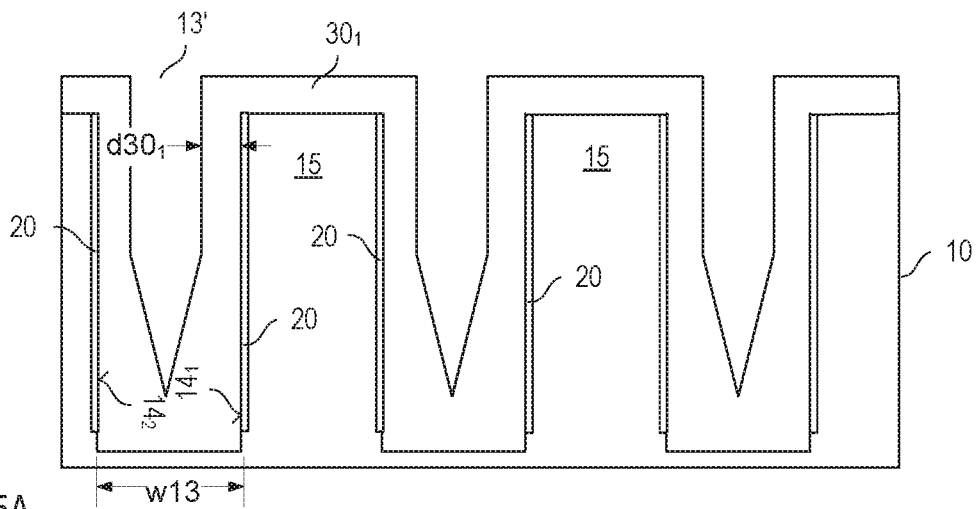
FIGS. 5A-5D illustrate another example of a method for filling trenches in the semiconductor layer.

FIGS. 5A to 5D illustrate another example of a method for filling the trenches 13. Referring to FIG. 5A, this method includes forming a first sub-layer $30_1$ of the second semiconductor layer 30 such that the first sub-layer $30_1$ covers the first semiconductor layer in the trenches 13 and on top of the mesa regions 15 and such that residual trenches $13_1$ remain. That is, a thickness $d30_1$ of the first sub-layer $30_1$ is smaller than 50% of the trench width w13. According to one example, the thickness $d30_1$ of the first-sub-layer $30_1$ is about 25% of the trench width w13 ($d30_1 \approx 0.25 \cdot w13$). According to one example, the first sub-layer $30_1$ is a non-doped layer. That is, a doping concentration of this layer is less than 8E13 $cm^{-3}$, or even less than 2E13 $cm^{-3}$. Forming the first sub-layer $30_1$ may include an epitaxial growth process.

Figure 5B:
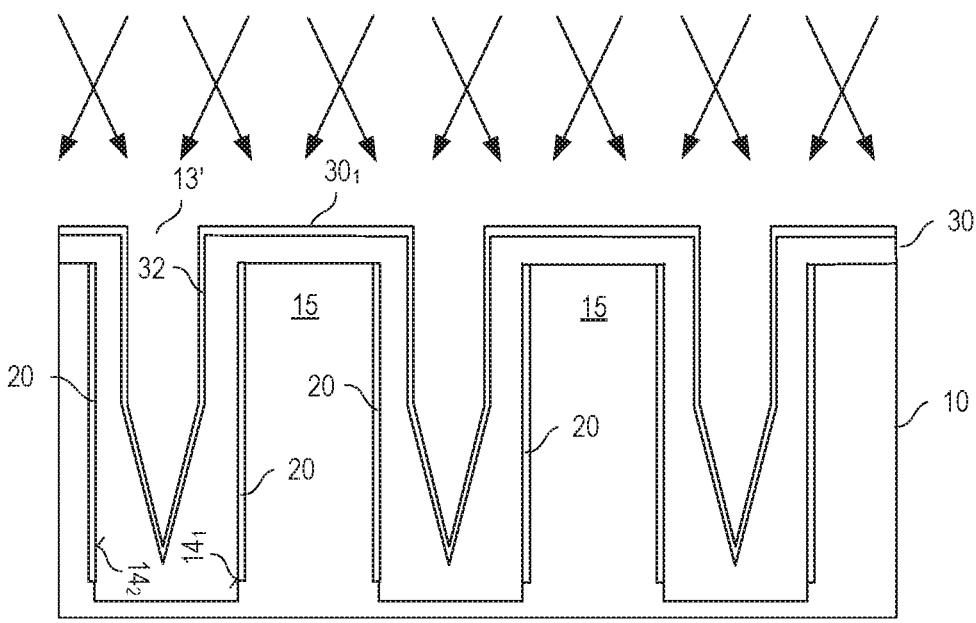

Referring to FIG. 5B, the method further includes implanting dopant atoms of the first doping type into the first sub-layer $30_1$ at least in those sections covering the sidewalls of the former trenches 13. This may include two tilt implantation processes, a first process in which dopant atoms are implanted into those sections of the first sub-layer $30_1$ covering the first sidewalls $14_1$ of the trenches 13, and a second implantation process in which dopant atoms are implanted into those sections of the first sub-layer $30_1$ covering the second sidewalls $14_2$. In these implantation processes, dopant atoms are not only implanted into those sections of the first sub-layer $30_1$ covering the sidewalls $14_1$, $14_2$, but also into those sections of the first sub-layer $30_1$ covering the mesa regions 15. In FIG. 5B, reference character 32 denotes an implanted region that includes dopant atoms of the first doping type formed by these implantation processes.

Figure 5C:
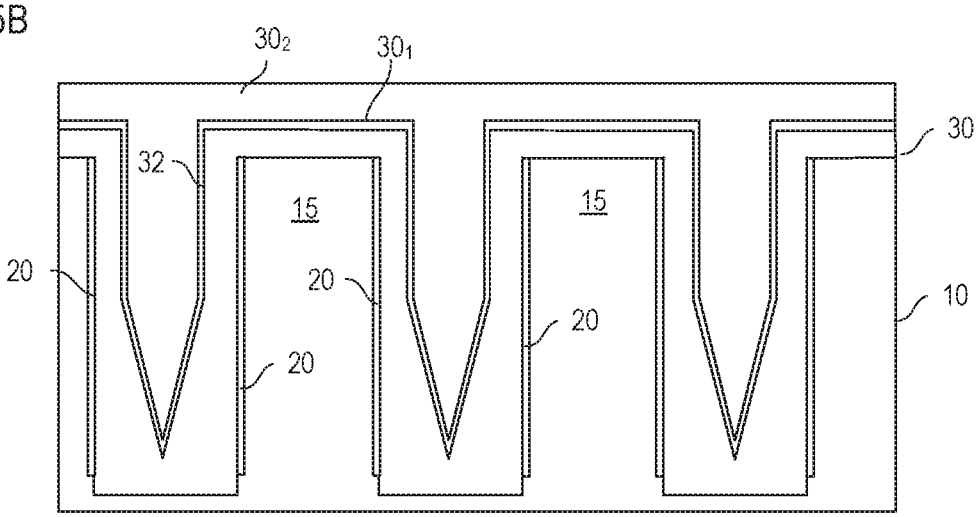

Referring to FIG. 5C, the method further includes forming a second sub-layer $30_2$ that covers the first sub-layer $30_1$ such that it fills the residual trenches 13'. According to one example, the second sub-layer $30_2$ is a non-doped layer. The second sub-layer $30_2$ may be formed by an epitaxial growth process.

Figure 5D:
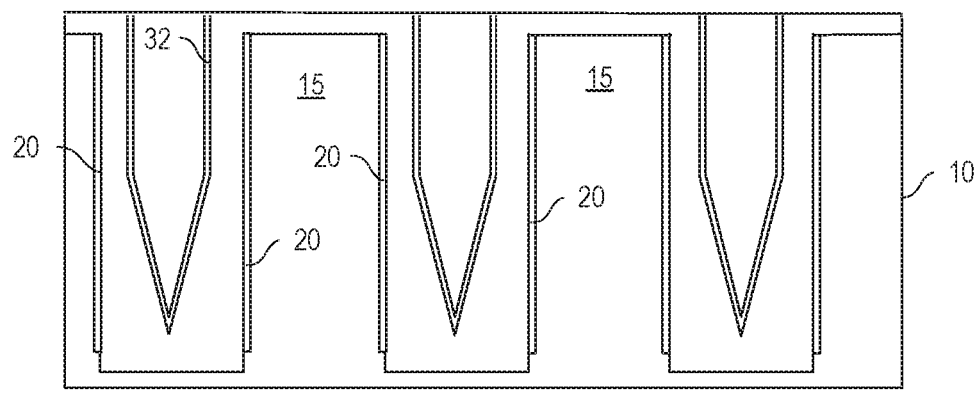

The dopant atoms of the first doping type implanted into the first sub-layer $30_1$ may be diffused and activated in the same diffusion process in which the dopant atoms of the first and second doping type introduced into the implanted regions 20 are diffused and activated. According to one example, the second layer 30 is at least partially removed before such diffusion process. The arrangement with the first semiconductor layer 10 and the second semiconductor layer 30 after such partially removing the second semiconductor layer 30 is shown in FIG. 5D. Partially removing the second semiconductor layer 30 may include the same processes explained with reference to FIG. 4B herein before.

Figure 6A:
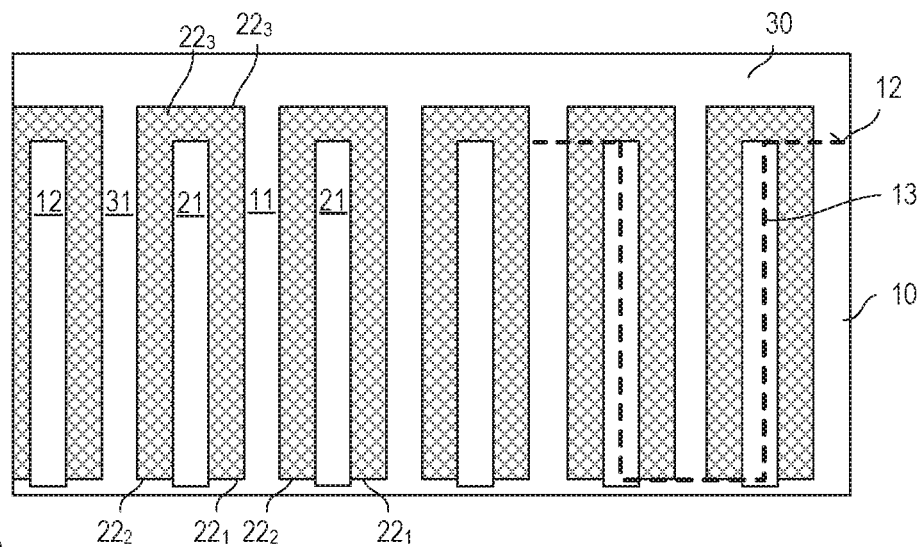
FIGS. 6A-6C illustrate a modification of the method illustrated in FIGS. 1A-1C.

Referring to the examples illustrated with reference to FIGS. 4A to 4C and 5A to 5D, the trenches 13 can be filled by forming the second semiconductor layer 30 such that it completely fills the trenches 13 and is grown on top of the surface 12 of the first semiconductor layer 10. Those sections of the second semiconductor layer 30 that are arranged above the first surface 12 of the first semiconductor layer 10 can be removed before the diffusion process. This, however, is only an example. FIG. 6A shows a semiconductor arrangement of the type shown in FIG. 4A or 5C, which is a semiconductor arrangement in which the second layer 30 has not been removed or has not completely been removed from above the mesa regions 15 before the diffusion process. In this diffusion process, the dopant atoms of the second doping type included in the implanted regions 20 not only diffuse in the lateral direction into the second semiconductor layer 20 but also diffuse into the second semiconductor layer 30 in the vertical direction z. The same applies to the dopant atoms of the first doping type included in the implanted regions 20. Due to the fact that the dopant atoms of the first doping type diffuse slower than the dopant atoms of the second doping type, each of the second regions 22, besides the first and second sections $22_1$, $22_2$ adjoining the respective first region 21 in the lateral direction, includes a third section $22_3$ that adjoins the first regions 21 in the vertical direction z. This third section $22_3$ "connects" the first and second sections $22_1$, $22_2$.

Referring to the above, the second semiconductor layer 30 can be formed by an epitaxial growth process. Between a second semiconductor layer 30 formed in this way and the first semiconductor layer 10, there is no visible border. Just for the purpose of illustration, the outline of the first semiconductor layer 10 before forming the second semiconductor layer 30 is illustrated in dashed lines in FIG. 6A.

Figure 6B:
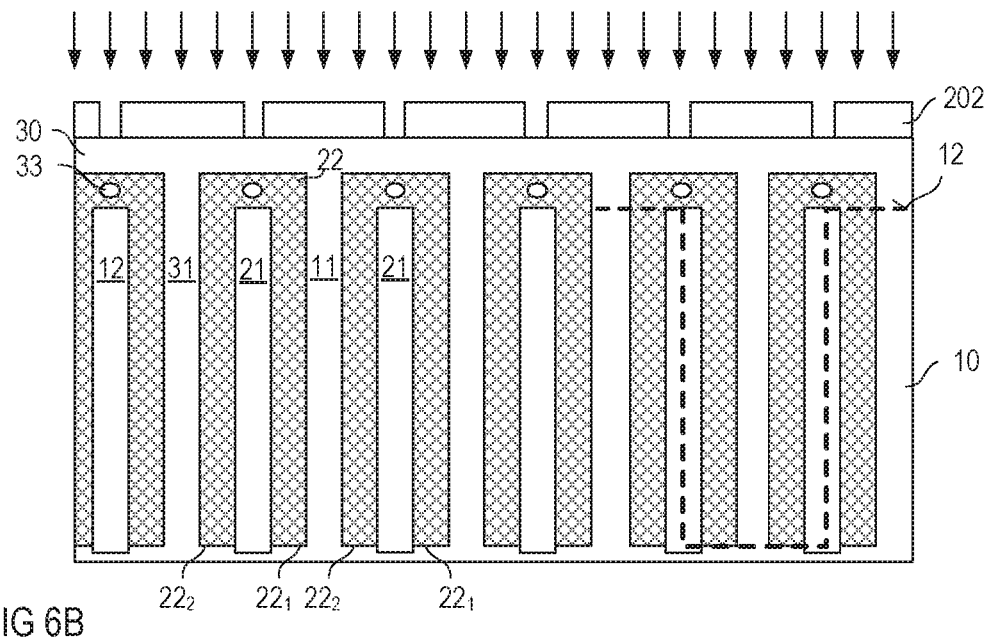
Figure 6C:
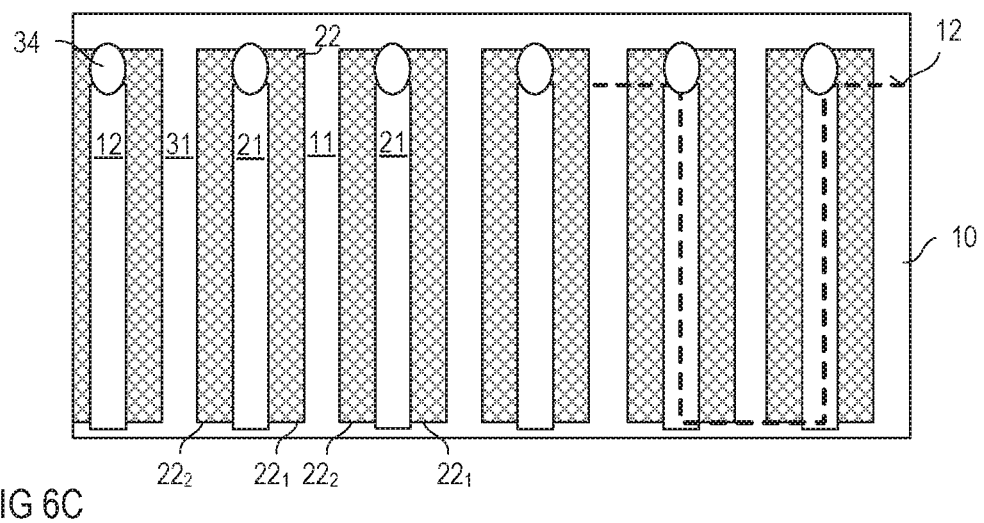

Referring to the above, using an implantation process of the type explained with reference to FIGS. 3A-3B, the first and second section $22_1$, $22_2$ of each second region 22 can be separated by the respective first region 21 at that end of the second region 22 facing away from the first surface 12 of the first semiconductor layer 10 or a first surface 32 of the second semiconductor layer 30. FIGS. 6B and 6C illustrate one example of a method for separating the first and second sections $22_1$, $22_2$ of each second region 22 by a doped region of the first doping type in an arrangement of the type shown in FIG. 6A, in which the second semiconductor layer 30 has been produced such that it covers the mesa regions 15.

Referring to FIG. 6B, this method includes implanting dopant atoms of the first doping type into the third sections $22_3$ of the second regions 22. Implanting the dopant atoms of the first doping type includes using a patterned implantation mask 202 formed on the first surface 32 of the second semiconductor layer 30. According to one example, openings of this implantation mask 202 are aligned with the first regions 21. Implanting the dopant atoms of the first doping type includes forming implanted regions 33 in the third sections $22_3$ of the second regions 22.

Referring to FIG. 6C, the method further includes a further diffusion process in which the dopant atoms of the first doping type implanted into the implanted regions 33 are activated and diffuse in the second regions 22 to form fifth doped regions 34 of the first doping type. According to one example, these fifth regions 34 are produced such that each of these fifth regions 34 adjoins one first region 12 and separates the first and second sections $22_1$, $22_2$ of the respective second region 22.

Referring to FIG. 6B, the dopant atoms of the first doping type can be implanted into the second semiconductor layer 30 after the first diffusion process, in which the dopant atoms of the first and second doping type diffuse from the implanted regions 20 and are activated. This, however, is only an example. According to another example (not illustrated), the implantation process illustrated in FIG. 6B takes place after the second semiconductor layer 30 has been formed, but before the first diffusion process.

The first semiconductor layer 10 with the basic doping of the first doping type and the plurality of trenches 13 can be produced in several ways. Two examples are explained with reference to FIGS. 7A to 7B and 8A to 8B below.

Figure 7A:
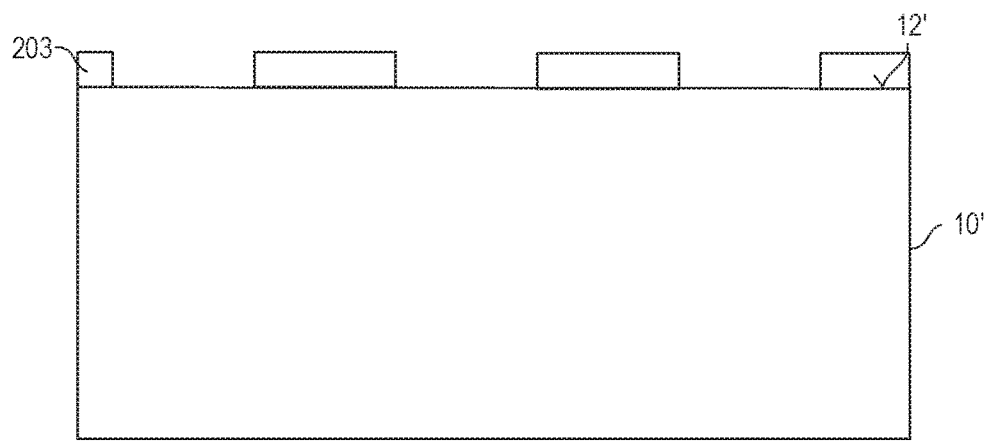
FIGS. 7A-7B illustrate one example of a method for forming a doped semiconductor layer including a plurality of trenches.
Figure 7B:
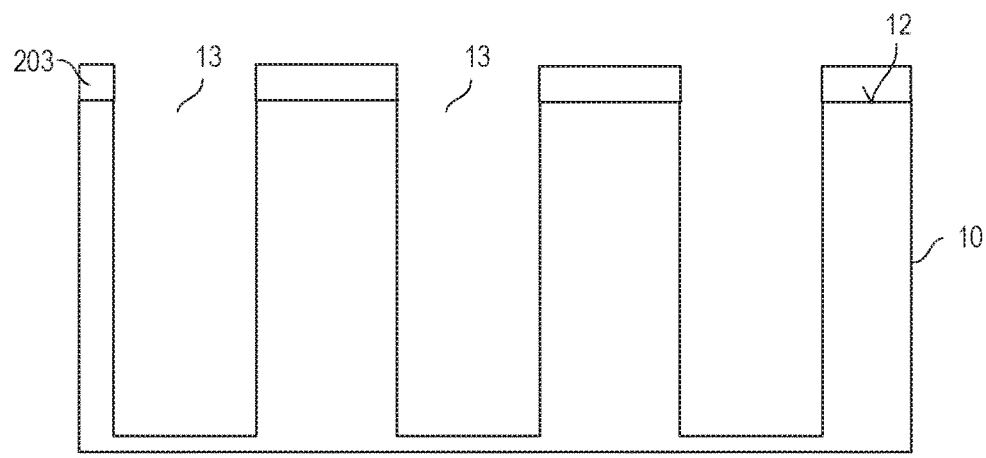

Referring to FIG. 7A, one example for forming the first semiconductor layer 10 may include providing a doped semiconductor layer 10' that has a basic doping of the first doping type, wherein a doping concentration of this basic doping equals the desired doping concentration of the basic doping of the first semiconductor layer 10. Referring to FIGS. 7A and 7B, the method further includes forming a patterned etch mask 203 on top of a first surface 12' of this semiconductor layer 10' and etching trenches using the etch mask 203 into the surface 12' of the semiconductor layer 10' in order to form the first semiconductor layer 10 with the plurality of trenches 13 separated by mesa regions 15. According to one example, the etch mask 203 is the same mask that is used as the implantation mask 201 in the process illustrated in FIG. 1A.

Figure 8A:
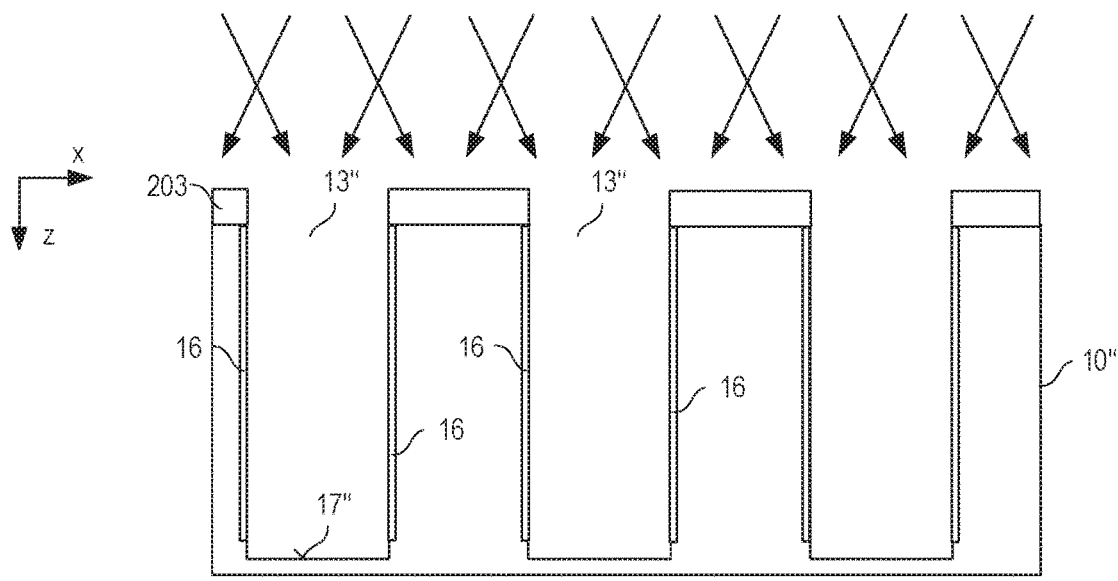
FIGS. 8A-8B illustrate another example of a method for forming a doped semiconductor layer including a plurality of trenches.
Figure 8B:
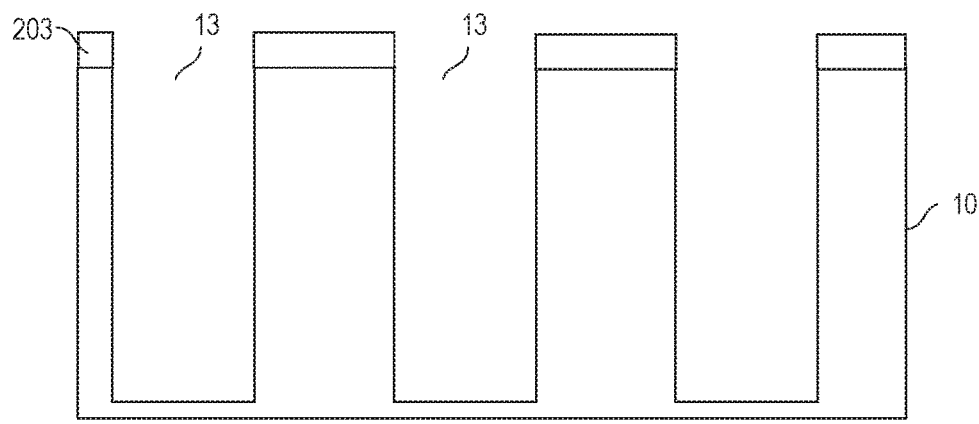

FIGS. 8A to 8B illustrate a modification of the method illustrated in FIGS. 7A to 7B. The method illustrated in FIGS. 8A to 8B is different from the method illustrated in FIGS. 7A to 7B in that a non-doped semiconductor layer 10" forms the basis of the first semiconductor layer 10. FIG. 8A shows the non-doped semiconductor layer 10" after etching a plurality of trenches 13" using the etch mask 203. These trenches 13" form the trenches 13 in the finished first semiconductor layer 10. In this method, the basic doping of the first semiconductor layer 10 is obtained by implanting dopant atoms of the first doping type in a tilt implantation process into opposite sidewalls of the trenches 13". Implanting the dopant atoms of the first doping type forms implanted regions 16 along sidewalls of the trenches 13". These implanted regions 16 can be generated such that, in the vertical direction z, they extend down to bottoms 17" of the trenches 13" or such that they do not extend down to the bottoms of the trenches 13".

The dopant atoms of the first doping type in the implanted regions 16 are activated and diffuse deeper into the semiconductor layer 10" in a diffusion process so as to form the basic doping of the first semiconductor layer 10. The first semiconductor layer 10 resulting from this diffusion process is illustrated in FIG. 8B. This diffusion process can take place before implanting the dopant atoms of the first and second doping type in the process explained with reference to FIG. 1A and the first diffusion process. According to another example, the dopant atoms in the implanted region 16 are diffused and activated in the first diffusion process.

According to one example, the semiconductor arrangements of the types shown in FIGS. 1C and 6C that include doped regions of the first doping type (the first, third and fourth regions 21, 11 and 31 in FIGS. 1C and 6C) and doped regions of the second doping type (the first and second sections $22_1$, $22_2$ of the second regions 22 in FIGS. 1C and 6C) are generated such that in horizontal section planes, which are section planes parallel to the surfaces 12, 32, an overall number of dopant atoms of the first doping type essentially equals an overall number of dopant atoms of the second doping type and that, in a volume given by the mesa regions 15 and the filled trenches 13, the overall number of dopant atoms of the first doping type essentially equals the overall number of dopant atoms of the second doping type. This can be obtained by the following and is explained further below:

(a) Adapting the implantation doses in the implantation process illustrated in FIG. 1B such that a first number $A_{D1}$ of dopant atoms of the first doping type introduced into each of the first and second sidewalls $14_1$, $14_2$ in the implantation process is about 50% of a second number $A_{B1}$ of dopant atoms resulting from the basic doping of the mesa region 15 and the second semiconductor layer 30 filling the trench and included in a volume that, beginning from the respective sidewall $14_1$, $14_2$, includes 50% of the mesa region 15 adjoining the respective sidewall and 50% of the filled trench 13 adjoining the respective sidewall.

(b) Adapting the implantation doses in the first implantation process such that a third number $A_{D2}$ of dopant atoms of the second doping type implanted into each of the first and second sidewall $14_1$, $14_2$ equals the number $A_{B1}+A_{D1}$ of dopant atoms of the first doping type resulting from the basic doping and introduced in the implantation process, that is, $$A_{D2} \approx A_{B1} + A_{D1} \tag{3a}$$

As, referring to (a), $A_{D1} \approx 0.5 \cdot A_{B1}$, this can be obtained by implementing the first implantation process such that the number of dopant atoms of the second type implanted into one sidewall essentially equals 3 times the number of dopant atoms of the first type implanted into the one sidewall, that is $$A_{D2} \approx 3 + A_{D1} \tag{3b}$$

The first number $A_{B1}$ of dopant atoms resulting from the basic doping and included in one volume including 50% of a filled trench 13 and 50% of a mesa region 15 is given by $$A_{b1} = \int_{x=-0.5 \cdot W13}^{0.5 \cdot W15} \int_{y=0}^{l13} \int_{z=0}^{d13} N_1 dx\, dy\, dz \tag{4}$$

where $N_1$ is the basic doping of the mesa region 15 and the second semiconductor layer 30. This basic doping can be homogenous, but not necessarily has to be homogenous. Further, d13 denotes the depth of the trenches 13, and 113 denotes the length of the trenches 13. The number $A_{D1}$ of dopant atoms of the first doping type introduced into one sidewall $14_1$, $14_2$ in the first implantation process is given by $$A_{D1} = D21 \cdot d20_2 \cdot l13 \tag{5a}$$

where D21 is a first dopant dose of dopant atoms of the first type implanted into the sidewall, and $d20_1$, referring to FIG. 3B, is the depth of the second section $20_2$ with the first type dopant atoms of the implanted region 20. The first dopant dose D21 is given by $$D21 = D1 \cdot \cos \alpha 2 \tag{6a}$$

where D1 is a first implantation dose of dopant atoms of the first type in the implantation process illustrated in FIG. 3B and α2 is the tilt angle. The "first implantation dose" is the dose in a plane perpendicular to the implantation direction. Equivalently, the number $A_{D2}$ of dopant atoms of the second doping type introduced into one sidewall $14_1$, $14_2$ in the first implantation process is given by $$A_{D2} = D22 \cdot d20_1 \cdot l13 \tag{5b}$$

where D22 is a second dopant dose of dopant atoms of the first type implanted in the sidewall, and $d20_2$, referring to FIG. 3A, is the depth of the first section $20_1$ with the second type dopant atoms of the implanted region 20. The second dopant dose D22 is given by $$D22 = D2 \cdot \cos \alpha 1 \tag{6b}$$

where D2 is the implantation dose in the implantation process illustrated in FIG. 3A and α1 is the implantation angle.

Referring to equation (3b), the overall number $A_{D2}$ of dopant atoms of the second type implanted into one sidewall in the first implantation process at least approximately equals 3 times the overall number $A_{D1}$ of dopant atoms of the first type implanted into one sidewall. Based on equations (5a) and (5b) this can be obtained by adapting the dopant doses to another such that:

$$D22 = 3 \frac{d20_1}{d20_2} D21, \tag{7a}$$

wherein this, approximately, can be obtained by selecting the first and second implantation doses such that $$D2 = 3 \cdot D1 \tag{7b}$$

Figure 9:
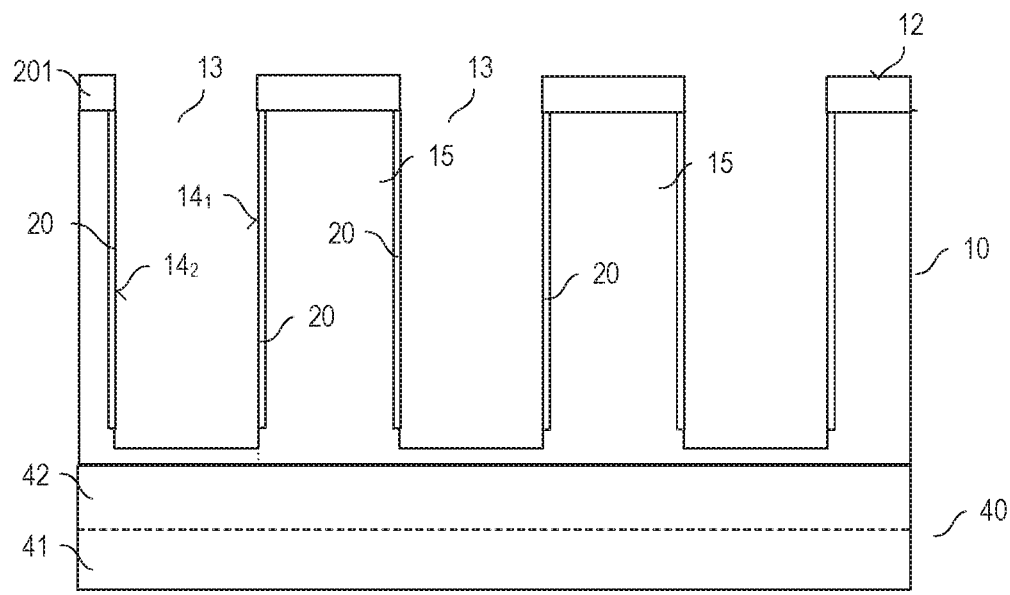
FIG. 9 illustrates the semiconductor layer shown in FIG. 1A arranged on a carrier according to a first example.

In the process explained with reference to FIGS. 5A to 5C, the second semiconductor layer 30 of $N_1$ can be obtained by implanting a dopant dose into each of the sidewalls of the residual trench 13 that equals the first dopant dose D21. Equivalently, in a process explained with reference to FIGS. 8A to 8B, a basic doping of the first semiconductor layer 10 of $N_1$ can be obtained by implanting a dopant dose into each of the first and second sidewalls $14_1$, $14_2$ that equals the first dopant dose D21. According to one example, an implantation dose in the process illustrated in FIG. 8A is selected from between 9E12 cm$^{-2}$ and 2E13 cm$^{-2}$. In the process illustrated in FIG. 5B the implantation dose is higher than in the process illustrated in FIG. 8A in order to obtain the same basic doping in the mesa regions 15 and the trenches filled with the second semiconductor layer 30, because a width of the residual trenches 13' is smaller than the trench width w13. In the drawings explained before, only the first semiconductor layer 10 and the second semiconductor layer 30 are illustrated. According to one example, the first semiconductor layer 10 is formed on a carrier. This is illustrated in FIG. 9, which shows the second semiconductor layer 10 after forming the implanted region 20. In this example, the first semiconductor layer 10 is arranged on a carrier 40. According to one example, the carrier 40 includes another semiconductor layer or semiconductor body. Forming the first semiconductor layer 10 on such carrier 40 may include an epitaxial growth process. According to one example, the carrier 40 includes two differently doped sub-layers, a first sub-layer 41 and a second sub-layer 42 arranged between the first sub-layer 41 and the first semiconductor layer 10. According to one example, the second sub-layer 42 has a lower doping concentration than the first sub-layer 41, but a higher doping concentration than a basic doping of the first semiconductor layer 10. According to one example, the first sub-layer 41 and the second sub-layer 42 have the same doping type and the same doping type as the basic doping of the first semiconductor layer 10, that is, the first doping type.

The method explained with reference to FIGS. 1A to 1C can be performed several times in order to form several structures of the type illustrated in FIG. 1C one above the other. This can be obtained by forming the first semiconductor layer 10 illustrated in FIG. 1A on top of an arrangement of the type illustrated in FIG. 1B, FIG. 4A, FIG. 5C or FIG. 5D before the first diffusion process. This is illustrated in FIG. 10 which shows the first semiconductor layer 10 after forming the implanted region 20, wherein this first semiconductor layer 10 has been formed on top of an arrangement that includes a carrier 40 and an arrangement with another first semiconductor layer $10_{-1}$ and another second semiconductor layer $30_{-1}$, wherein this arrangement is the result of the method explained with reference to FIGS. 1A to 1B or one of its modifications explained with reference to the other drawings herein before.

Figure 10:
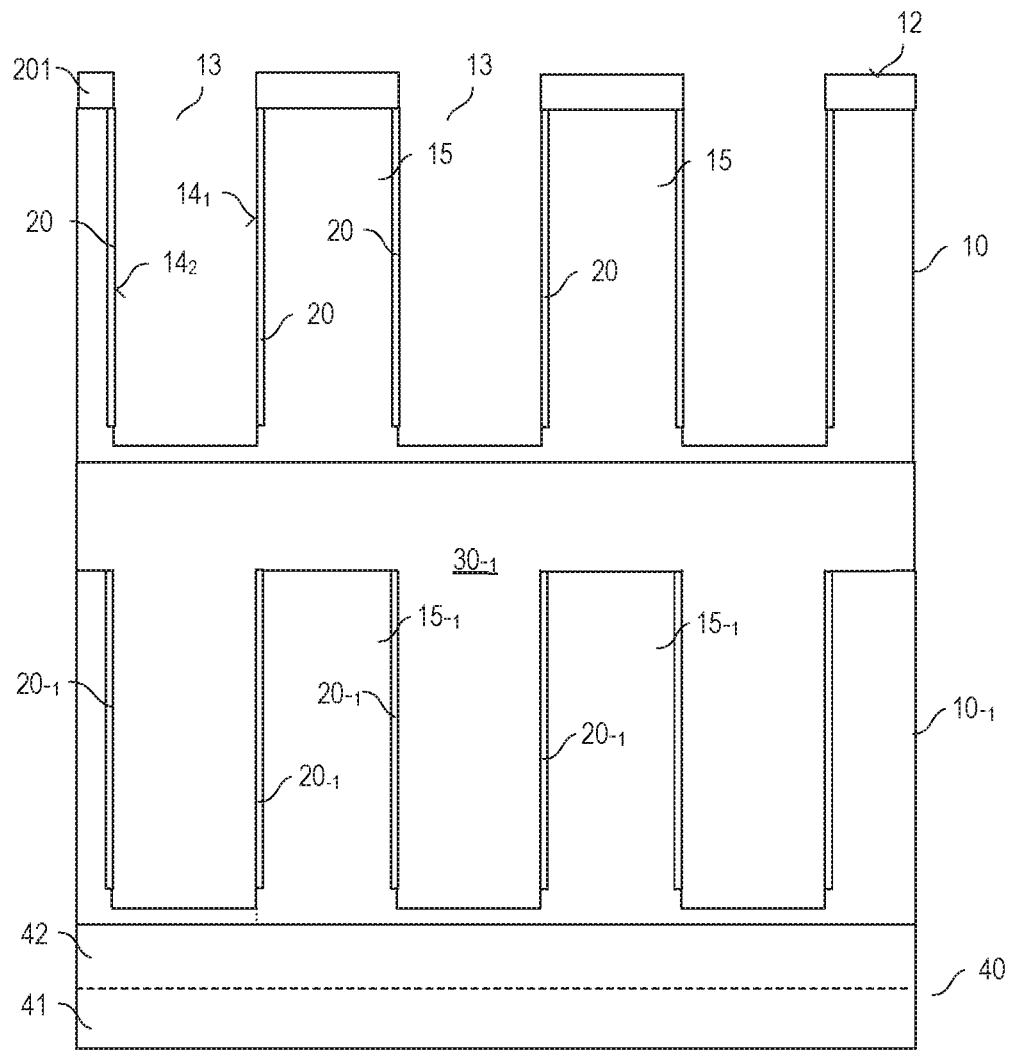
FIG. 10 illustrates the semiconductor layer shown in FIG. 1A arranged on a carrier according to another example.
Figure 11:
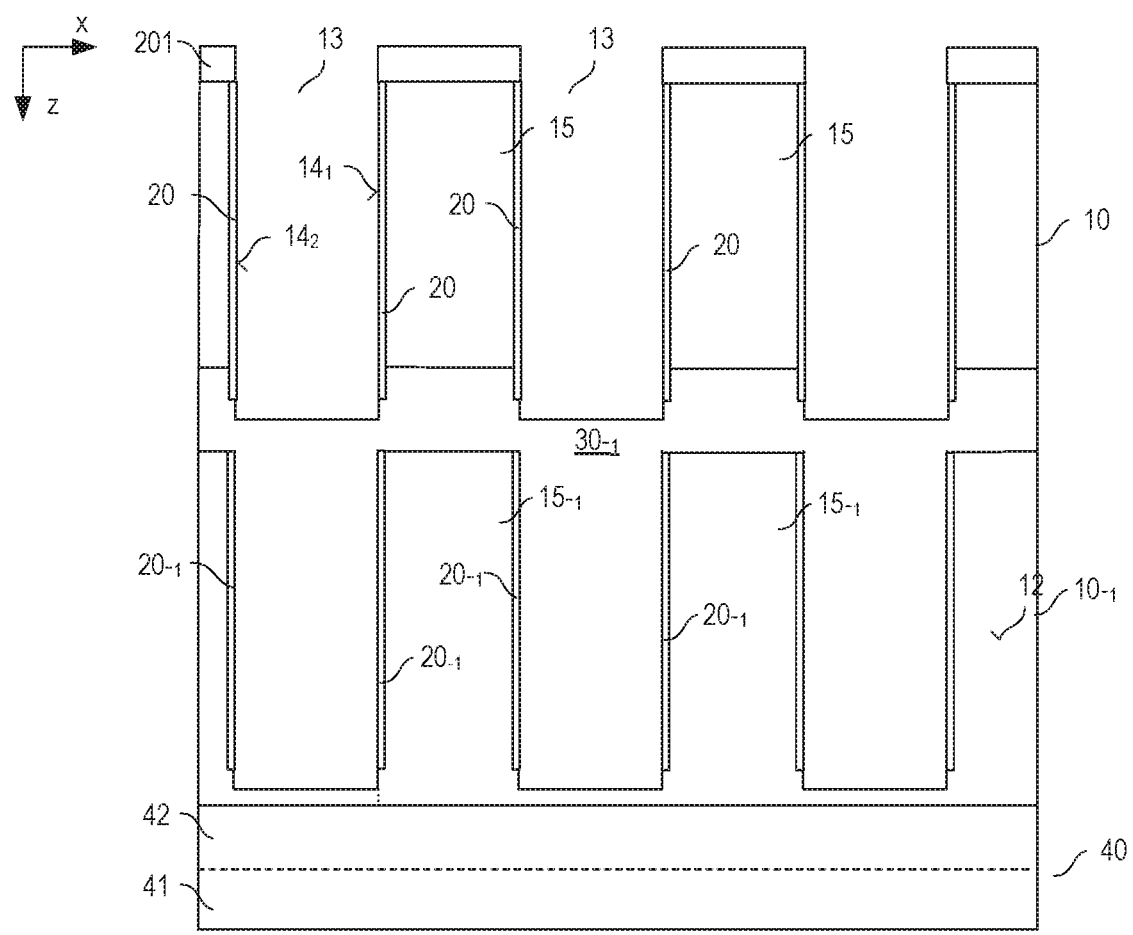
FIG. 11 illustrates a modification of the arrangement shown in FIG. 10.

In the example illustrated in FIG. 10, the trenches 13 in the first semiconductor layer 10 end within the first semiconductor layer 10. This, however, is only an example. FIG. 11 shows a modification of the arrangement shown in FIG. 10. The arrangement shown in FIG. 11 is different from the arrangement shown in FIG. 10 in that the trenches 13 in the first semiconductor layer 10 extend through the first semiconductor layer 10 into the second semiconductor layer $30_{-1}$ of the carrier arrangement. The "carrier arrangement" is the arrangement with the carrier 40 and the arrangement with the other first semiconductor layer $10_{-1}$ and the other second semiconductor layer $30_{-1}$.

Figure 12:
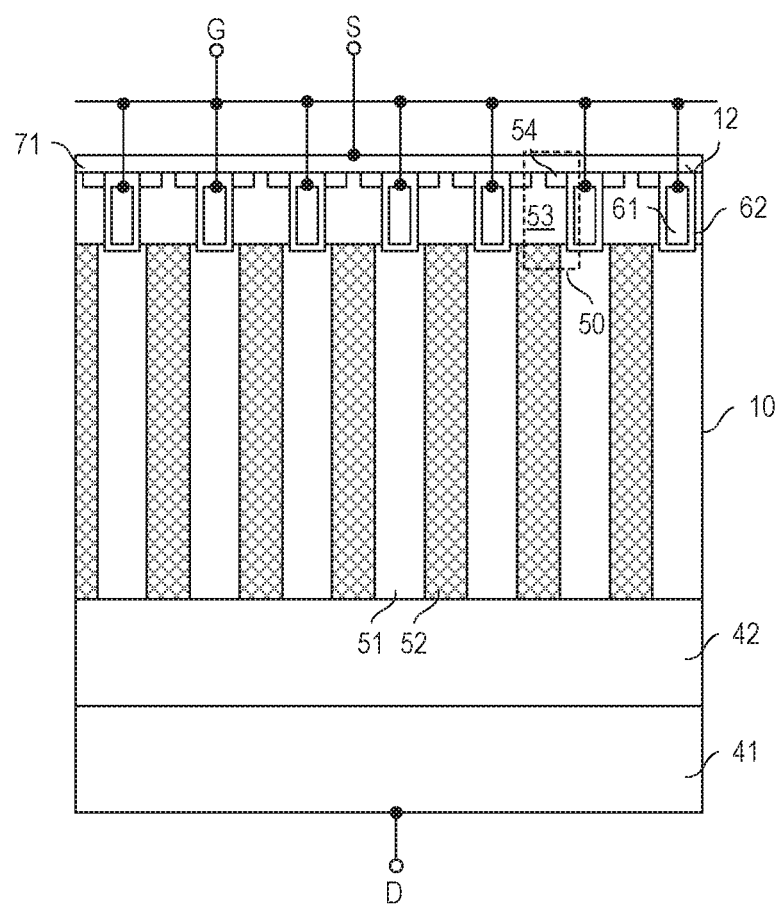
FIG. 12 illustrates one example of a superjunction transistor device that includes a semiconductor layer with a plurality of complementarily doped semiconductor regions.

Referring to the above, the arrangement with the plurality of doped regions of the first doping type and the plurality of doped regions of the second doping type can form the basis of a superjunction transistor device. One example of a superjunction transistor device is illustrated in FIG. 12. This superjunction transistor device includes a drift region with a plurality of complementarily doped semiconductor regions 51, 52. This drift region can be formed by a process in accordance with any of the examples explained herein before. The doped regions 51 of the first doping type are formed either by the first regions 21, the third regions 11 or the fourth regions 31, and the doped regions 52 of the second doping type are formed either by the first sections or the second sections 22$_1$, 22$_2$ of the second regions 22. These doped regions can be produced by performing the method explained with reference to FIGS. 1A to 1C once or by performing this method two or more times.

Referring to FIG. 12, a drain region 41 of the superjunction transistor device can be formed by the first sub-layer of the carrier 40 explained with reference to FIGS. 9 to 11. An optional buffer layer 42 can be formed by the second sub-layer 42. Either the drain region 41 or the buffer region 42 adjoins each of the first and second regions 51, 52 of the drift region 51, 52. It should be noted that the first regions 51 may also be referred to as drift regions and the second regions 52 may also be referred to as compensation regions.

Referring to FIG. 12, the superjunction transistor device further includes a plurality of transistor cells 50. Each of these transistor cells 50 includes a body region 53, a source region 54, a gate electrode 61 and a gate dielectric 62. The body region 53 of each transistor cell 50 adjoins one of the second regions 52 and one of the first regions 51 and separates the source region 54 from the drift region 51, 52. The gate electrode 61 is adjacent the body region 53 and dielectrically insulated from the body region 53 by a gate dielectric 62. The source and body regions 53 are electrically connected to a source electrode 71 which is connected to a source node S or forms a source node of the transistor device. The gate electrodes 61 are electrically connected to a gate node. The drain region 41 is connected to a drain node D or forms the drain node of the superjunction transistor device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A method, comprising:
    implanting dopant atoms of a first doping type and dopant atoms of a second doping type in a first implantation process into opposite sidewalls of each of a plurality of trenches of a first semiconductor layer having a basic doping of the first doping type, the dopant atoms of the first doping type having a smaller diffusion coefficient than the dopant atoms of the second doping type;
    filling each of the plurality of trenches with a second semiconductor layer of the first doping type; and
    diffusing the dopant atoms of the first doping type and the dopant atoms of the second doping type in a first diffusion process such that a plurality of first regions of the first doping type and a plurality of second regions of the second doping type are formed,
    wherein the plurality of second regions are spaced apart from each other,
    wherein each of the plurality of first regions is at least partially arranged within a respective one of the plurality of second regions,
    wherein filling each of the plurality of trenches with the second semiconductor layer comprises:
        forming a first sub-layer of the second semiconductor layer that at least covers the sidewalls of each of the plurality of trenches;
        implanting dopant atoms of the first doping type into the first sub-layer; and
        forming a second sub-layer of the second semiconductor layer on the first sub-layer.

2. The method of claim 1, further comprising, before implanting the dopant atoms of the first doping type and the dopant atoms of the second doping type:
    forming the basic doping of the first semiconductor layer in an epitaxial growth process before forming the plurality of trenches of the first semiconductor layer.

3. The method of claim 1, further comprising, before implanting the dopant atoms of the first doping type and the dopant atoms of the second doping type:
    forming the basic doping of the first semiconductor layer by implanting dopant atoms of the first doping type in a second implantation process into opposite sidewalls of the plurality of trenches and diffusing the implanted dopant atoms.

4. The method of claim 3, wherein diffusing the implanted dopant atoms takes place before the first implantation process.

5. The method of claim 3, wherein diffusing the implanted dopant atoms takes place in the first diffusion process.

6. The method of claim 1, wherein the dopant atoms of the first type implanted in the first implantation process are atoms of a first chemical element and dopant atoms forming the basic doping of the first semiconductor layer are atoms of a second chemical element different from the first chemical element.

7. The method of claim 6, wherein the first chemical element is phosphorous and the second chemical element is arsenic.

8. The method of claim 1, wherein filling each of the plurality of trenches with the second semiconductor layer comprises forming the second semiconductor layer also on top of mesa regions of the first semiconductor layer.

9. The method of claim 8, further comprising:
    at least partially removing the second semiconductor layer from above the mesa regions.

10. The method of claim 1, wherein the first semiconductor layer comprises a plurality of mesa regions, wherein each of the plurality of mesa regions is arranged between a respective pair of two neighboring trenches, and wherein a width of each of the plurality of trenches is between 0.9 times and 1.1 times a width of each of the plurality of mesa regions.

11. The method of claim 1, wherein forming each of the plurality of second semiconductor regions comprises forming a first section and a second section of the second semiconductor region such that the first section and the second section are separated by a respective one of the plurality of first semiconductor regions.

12. The method of claim 11, wherein forming each of the plurality of second semiconductor regions further comprises forming a third section between the first section and the second section, and wherein the method further comprises:
    implanting dopant atoms of the first doping type into the third section.

13. The method of claim 1, further comprising:
    forming a plurality of transistor cells such that a body region of each of the plurality of transistor cells adjoins a section of a respective one of the plurality of second doped regions.

14. The method of claim 1, further comprising:
repeating the first implantation process, forming the second semiconductor layer, and the diffusing at least once,
wherein before each repetition, a further first semiconductor layer is formed.

15. A method, comprising:
implanting dopant atoms of a first doping type and dopant atoms of a second doping type in a first implantation process into opposite sidewalls of each of a plurality of trenches of a first semiconductor layer having a basic doping of the first doping type, the dopant atoms of the first doping type having a smaller diffusion coefficient than the dopant atoms of the second doping type;
filling each of the plurality of trenches with a second semiconductor layer of the first doping type; and
diffusing the dopant atoms of the first doping type and the dopant atoms of the second doping type in a first diffusion process such that a plurality of first regions of the first doping type and a plurality of second regions of the second doping type are formed,
wherein the plurality of second regions are spaced apart from each other,
wherein each of the plurality of first regions is at least partially arranged within a respective one of the plurality of second regions,
wherein forming each of the plurality of second semiconductor regions comprises forming a first section and a second section of the second semiconductor region such that the first section and the second section are separated by a respective one of the plurality of first semiconductor regions,
wherein forming each of the plurality of second semiconductor regions further comprises forming a third section between the first section and the second section,
wherein the method further comprises implanting dopant atoms of the first doping type into the third section.

16. A method, comprising:
implanting dopant atoms of a first doping type and dopant atoms of a second doping type in a first implantation process into opposite sidewalls of each of a plurality of trenches of a first semiconductor layer having a basic doping of the first doping type, the dopant atoms of the first doping type having a smaller diffusion coefficient than the dopant atoms of the second doping type;
filling each of the plurality of trenches with a second semiconductor layer of the first doping type; and
diffusing the dopant atoms of the first doping type and the dopant atoms of the second doping type in a first diffusion process such that a plurality of first regions of the first doping type and a plurality of second regions of the second doping type are formed,
wherein the plurality of second regions are spaced apart from each other,
wherein each of the plurality of first regions is at least partially arranged within a respective one of the plurality of second regions,
wherein an overall number of the dopant atoms of the second type implanted into one sidewall in the first implantation process at least approximately equals 3 times an overall number of the dopant atoms of the first type implanted into the one sidewall.

17. The method of claim 16, wherein between two neighboring ones of the second regions either a third region of the first doping type or a fourth region of the first doping type is arranged.

18. The method of claim 17, wherein the third region is formed by a section of a mesa region of the first semiconductor layer that has the basic doping of the first semiconductor layer.

19. The method of claim 17, wherein the fourth region is formed by a section of the second semiconductor layer that fills a trench and has a basic doping of the second semiconductor layer.

* * * * *